US010401804B1

(12) United States Patent
Van Zile, III et al.

(10) Patent No.: US 10,401,804 B1
(45) Date of Patent: Sep. 3, 2019

(54) MATE CONTROLLER

(71) Applicant: Dassault Systemes SolidWorks Corporation, Waltham, MA (US)

(72) Inventors: Donald Van Zile, III, Waltham, MA (US); Zheng Ye, Redwood City, CA (US); Adrian Ilie, Cambridge (GB)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 294 days.

(21) Appl. No.: 15/363,976

(22) Filed: Nov. 29, 2016

Related U.S. Application Data

(60) Provisional application No. 62/272,231, filed on Dec. 29, 2015.

(51) Int. Cl.
  *G05B 13/02* (2006.01)
  *G05B 19/402* (2006.01)
  *G06F 17/50* (2006.01)

(52) U.S. Cl.
  CPC ......... *G05B 13/021* (2013.01); *G05B 19/402* (2013.01); *G06F 17/5009* (2013.01); *G05B 2219/49008* (2013.01)

(58) Field of Classification Search
  CPC .. G06F 17/50; G06F 3/04815; G06F 3/04842; G06F 3/04845; G06F 17/5009; G06T 17/10; G06T 19/20; G06T 2200/24; G06T 2210/04; G06T 2219/2008; G06T 2219/2021; G05B 13/021; G05B 19/402; G05B 2219/49008
  See application file for complete search history.

(56) References Cited

U.S. PATENT DOCUMENTS

| 5,835,693 | A | * | 11/1998 | Lynch | ................... B25J 9/1605 345/473 |
| 6,219,049 | B1 | * | 4/2001 | Zuffante | ................. G06F 17/50 345/420 |
| 6,295,063 | B1 | * | 9/2001 | Minami | ................... G06T 13/20 345/419 |

(Continued)

OTHER PUBLICATIONS

Jacob, J., "SOLIDWORKS 2016 is Here and it's Bigger and Better than Ever" Blog (2015) retrieved from http://blogs.3ds.com/northamerica/solidworks-2016-is-here-and-its-bigger-and-better-than-ever/.

*Primary Examiner* — Mohammed Shamsuzzaman
(74) *Attorney, Agent, or Firm* — Hamilton, Brook, Smith & Reynolds, P.C.

(57) ABSTRACT

CAD modeling method, system, and apparatus provide an on-demand mate controller for controlling settings of mating relationships in a CAD model. The names of mates of a CAD model assembly are auto-populated into an ordered list in the mate controller. The mate controller enables user interactive re-ordering of the listed names. With the mate controller, a user may temporarily unlock a mate, visually position assembly components, and relock the mate resulting in refined mate settings and degrees of freedom of assembly components. The mate controller enables a user to interactively change order of positions of the model assembly which in turn affects order of position changes in motion studies of the model assembly. The mate controller saves per position data of the model assembly including mate values and component degrees of freedom. The saved per position data can be readily used to create animations.

19 Claims, 14 Drawing Sheets

(56) References Cited

U.S. PATENT DOCUMENTS

| | | | | |
|---|---|---|---|---|
| 6,826,436 | B1* | 11/2004 | Bogan | G06F 17/5086 |
| | | | | 700/98 |
| 6,898,560 | B1* | 5/2005 | Das | G06F 17/50 |
| | | | | 703/22 |
| 7,313,504 | B2* | 12/2007 | Chin | G06T 17/10 |
| | | | | 700/97 |
| 7,853,940 | B1* | 12/2010 | Han | G06F 17/50 |
| | | | | 345/631 |
| 8,825,450 | B2* | 9/2014 | Artur | G06F 17/50 |
| | | | | 703/1 |
| 8,892,404 | B2* | 11/2014 | Potter | G06F 17/50 |
| | | | | 703/1 |
| 9,135,372 | B2* | 9/2015 | Delarue | G06F 3/0482 |
| 9,972,127 | B1* | 5/2018 | Gibson | G06T 17/10 |
| 10,055,514 | B2* | 8/2018 | Gibson | G06F 17/50 |
| 10,074,218 | B1* | 9/2018 | Gibson | G06T 17/10 |
| 10,127,332 | B2* | 11/2018 | Gibson | G06F 17/5086 |
| 2012/0156362 | A1* | 6/2012 | Sadovoy | B05B 12/084 |
| | | | | 427/9 |
| 2012/0220194 | A1* | 8/2012 | Maloney | B24B 27/0038 |
| | | | | 451/5 |
| 2013/0080121 | A1* | 3/2013 | Gibson | G06F 17/50 |
| | | | | 703/1 |
| 2015/0178413 | A1* | 6/2015 | Gibson | G06F 17/50 |
| | | | | 703/1 |
| 2015/0293525 | A1* | 10/2015 | Yamamoto | G06T 19/20 |
| | | | | 702/182 |
| 2017/0169135 | A1* | 6/2017 | Kumar | G06T 7/13 |

* cited by examiner

MATE CONTROLLER

RELATED APPLICATION

This application claims the benefit of U.S. Provisional Application No. 62/272,231, filed on Dec. 29, 2015. The entire teachings of the above application are incorporated herein by reference.

BACKGROUND

Computer-Aided Design (CAD) software enables the user to construct and manipulate complex three-dimensional (3D) models representative of real-world physical objects. A number of CAD systems and programs are offered in the marketplace that construct 3D models and enable engineers to design parts and assemblies, such as the product provided by the Dassault Systemes SolidWorks Corporation under the trademark SOLIDWORKS.

A number of different modeling techniques can be used to create a 3D model. Solid modeling is one such technique. Solid modeling provides topological 3D models where the 3D model is a collection of interconnected topological entities such as vertices, edges, and faces. The topological entities have corresponding supporting geometrical entities such as points, trimmed curves, and trimmed surfaces. The trimmed surfaces correspond to the topological faces bounded by the edges.

Another modeling technique is parametric modeling. CAD systems may combine solid modeling and parametric modeling techniques. Parametric modeling techniques can be used to define various parameters for different features and components of a model, and to define relationships between those features and components based on relationships between the various parameters. The parametric nature of a CAD system enables constraints (e.g. relationships between features) to influence the geometric representation of the model.

A design engineer is a typical user of a 3D CAD system. The design engineer designs physical and aesthetic aspects of 3D models and is skilled in 3D modeling techniques. In a 3D model, the design engineer creates parts consisting of features typically resulting from operations such as a sweep, a revolve, an extrusion and so on. Other features may be applied to a part. For example, a fillet feature when applied to a part rounds one or more edges, a chamfer feature creates a beveled edge, and a draft feature adds an angle to one or more faces in a part.

The design engineer may assemble the parts into a subassembly, and a subassembly may also consist of other subassemblies. An assembly is designed using parts and subassemblies. Parts and subassemblies are herein generically referred to as "components" of the 3D model or simply a "model component" or an "assembly component."

A CAD assembly can have components with many degrees of freedom for modeling movement and motion. In turn, the CAD assembly may model a mechanical mechanism or device having many different positions and a range of motion. To better understand how the mechanical device achieves (and thus how the CAD model should achieve and maintain) different positions through a range of motion, the design engineer may use a motion study. Animation is one such motion study in CAD systems.

Animation typically animates the motion of model assemblies by adding motors to drive the motion of one or more parts or components of an assembly. The design engineer specifies the positions of assembly components at various times using set key points. The animation operation uses interpolation to define the motion of assembly components between key points, and thus to specify point-to-point motion of parts and components in assemblies.

Other motion studies in CAD systems include physics-based simulations. That is, in addition to illustrating motion, a simulation takes into account physical aspects such as mass, inertia, and material make-up of a model and its components.

A timeline user interface is used to implement most animations and simulations of CAD motion studies. The timeline displays the times and types of events in the animation or simulation. Key points are used in the timeline to represent a beginning or end of a change in animation position or other visual attributes of model components at a given time. Thus each key point corresponds to respective defined assembly component positions, visual properties and simulation element states. A keyframe is the timeline area or portion of the timeline that lies between key points and can be any length of time. The keyframe defines the timeframe in which assembly component motion or visual property changes take place. As the design engineer: (i) positions the indication of current time (called the time bar) in the timeline user interface, (ii) moves model components in a graphics area of the modeling interface, (iii) adds simulation elements, or (iv) changes the visual properties, the timeline displays changes using key points and change bars. The change bars are horizontal bars connecting the key points. Each change bar indicates a change between key points and can be color-coded to visually identify the model component and type of change.

The timeline interface and keyframe approach are not intuitive or well understood. To further compound matters, motion studies (i.e. animation or simulation of the model motion) do not change an assembly of a 3D CAD model or the properties of the assembly. Instead motion studies simulate and animate the motion that the design engineer prescribes for the 3D model. However a certain property of CAD model components called "mates" can be used to restrict the motion of the components in an assembly when modeling motion in a CAD system.

In a CAD model, the mates property creates geometric relationships (such as coincident, perpendicular, tangent, and so on) between assembly components. Each mate type is valid for specific geometry combinations. As the design engineer adds mates to model components, he or she defines the allowable directions of linear or rotational motion of the components. In motion studies (i.e. animations and simulations), mates are solved together at the same time, and thus are solved as a system. A mate can be suppressed in a motion study. In this way, the design engineer can have a component move within its degrees of freedom, visualizing the CAD assembly's behavior.

SUMMARY OF THE INVENTION

In order to achieve precise movement of a CAD assembly, the design engineer must define (create and specify) components to be in specific positions with respect to other components in the assembly. Such creation and placement of components in a CAD model can be very cumbersome. The design engineer iterates between (a) keyframes in the timeline interface of a motion study and (b) mate and other property settings and model parameters of the modeling interface in order to make adjustments to model components (i.e., to reposition model components). Searching the CAD model for all mates to edit them is a time-consuming task met with a lot of guesswork of mate values to try. Maintaining and editing potential mate values and settings can also be a tedious task.

Users typically create many configurations of CAD assemblies just to achieve different positions of the assembly by simply changing mate values only. Adding more configurations to a CAD assembly solely for purposes of achieving the different positions of the assembly components results in needless "bloating" of already large CAD model files. Maintaining the multiple configurations of the CAD assembly is also cumbersome.

Embodiments of the present invention address the foregoing shortcomings and disadvantages of the art. With the present invention, Applicants provide a user interface tool for CAD systems. The tool produces a computer-implemented mate controller on demand during a modeling session. The mate controller is automatically populated with names or other indications of mates in the subject model assembly. This auto-population of mate names in the controller saves the user the time and trouble of manually searching the CAD model for mates and associated mate names.

The mate controller maintains an ordered list of the mates by name. The mate controller enables the user to interactively re-order the list of mates for user convenience.

In addition to the names of mates, the mate controller displays respective current mate settings (values). For each of different positions of the model assembly, the mate controller presents the various mate values and degrees of freedom of assembly components. The mate controller can save the per-position data (i.e. mate values and component degrees of freedom), and enables the user to readily use the saved position data to create animations. The ability to save and apply (or otherwise export) to animations and motion studies the user-defined per-position data is more efficient and intuitive (visually straightforward) than heretofore achieved.

A toggle switch or equivalent of the mate controller enables a user to temporarily unlock mates so that associated model components can be visually positioned by the user in the model display. The temporary unlocking of mates allows the user to more easily reposition model components and refine mate settings and other settings without the time consuming and cumbersome steps of the prior art (such as found in the key frame approach). The toggle switch is subsequently used to relock the mate accordingly.

Embodiments provide a method, system and apparatus of CAD modeling. The method and system comprise providing a mate controller that controls settings for making relationships in a CAD model. Through a user interface tool, the system/method launches an instance of the mate controller in response to user command with respect to a model assembly of the CAD model. Next, the system/method auto populates in the mate controller indications of mating relationships in the CAD model. The mate controller holds the indications in an order and enables user interactive re-ordering of the indications. Per position of a model assembly, the mate controller saves position data including mating relationship values and degrees of freedom of assembly components, for motion studies application. The mate controller enables a user to: (a) change the order of position changes in motion studies of the CAD model by reordering the names of the positions of the model assembly in a list of the user interface, and to (b) add new positions of the model assembly. The new position may be based on current mate settings.

As a result, embodiments of the present invention provide step saving advantages and efficiencies of controlling mates and mate settings (values) in CAD modeling systems.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

The teachings of all patents, published applications and references cited herein are incorporated by reference in their entirety.

For purposes of illustration and not limitation, shown in FIGS. 1A-1D are different screen views generated by a CAD system 1000 embodying the present invention. CAD system 1000 executes or otherwise operates modeling software such as products under the trademark SOLIDWORKS by Applicants, enhanced by aspects of the present invention. Further description of the digital processor and hardware configuration of CAD system 1000 is given later with respect to FIGS. 5 and 6.

Figure 1A:
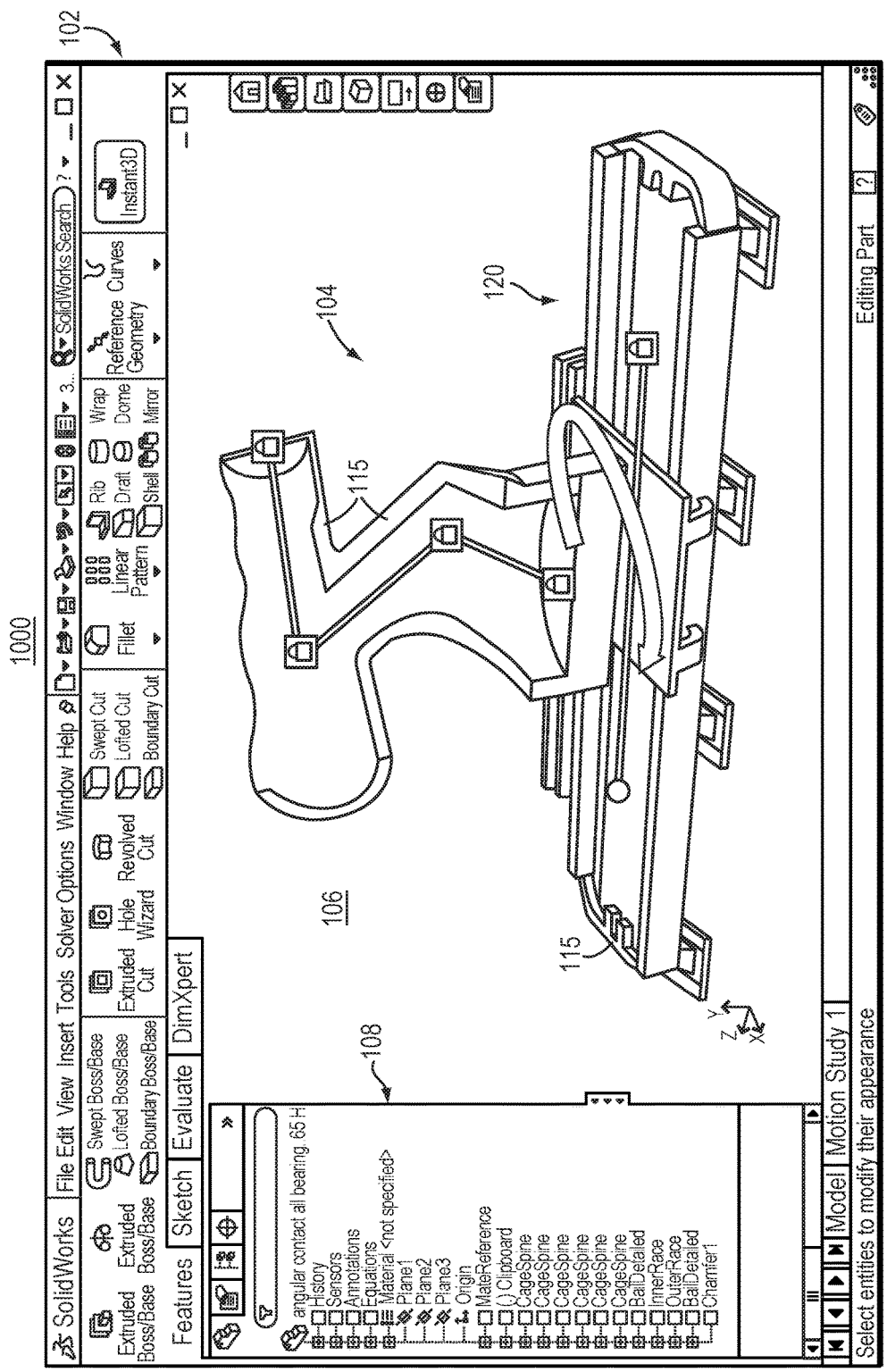
FIGS. 1A-1D illustrate various screen views of a CAD modeling system in embodiments of the present invention.

In FIG. 1A, CAD system 1000 renders a subject model 104 of a real-world object in a modeling space 106 of a screen view 102. A side panel 108 provides various interactive sets of information supplementing and complementing the user's activities and operations with model 104.

One interactive set of information displayable in side panel 108 is a feature tree. The feature tree lists names of features arranged in order of creation in model 104. For an assembly of the model 104, the model feature tree displays: (i) indications or symbols of components (i.e., parts, or subassemblies) and features thereof, (ii) a mates folder, and (iii) indications of assembly features. The feature tree and user interaction therewith provides feature management of model 104.

Another user interactive set of information displayable in side panel 108 is for property management of models. Different tools of CAD system 1000 use side panel 108 to: (a) display properties of a subject model component or feature, and (b) enable user interactive setting of property values thereof. Property values include dimensional values, degrees of freedom, and mate attributes, among others.

Mates create geometric relationships between assembly components of a model. Some examples of mating relationships include:

A coincident mate forces two planar faces to become co-planar. The faces are restricted to move along one another, and cannot be pulled apart.

A concentric mate forces two cylindrical faces to become concentric. The faces are restricted to move along the common centering axis and cannot be moved away from this axis.

When a user creates a new assembly for the model 104, CAD system 1000 automatically includes an initially empty mate folder in the feature tree. The user uses the property management user-interface to create a mate between assembly components by specifying: mate type, names of components affected, and values of respective mate settings (e.g. in degrees, distance, percentage, etc.). Mate types may include: angle, limit angle, limit distance, slot (distance along slot, or percentage along slot), width (dimension, or percent), and others for non-limiting example. For each mating relationship between assembly components that the user creates, the CAD system 1000 adds an indication in the mate folder including listing names of the components involved.

The hierarchy and tree structures of the sets of information in side panel 108 represent the relationships and connections between the various model components 115.

Figure 1B:
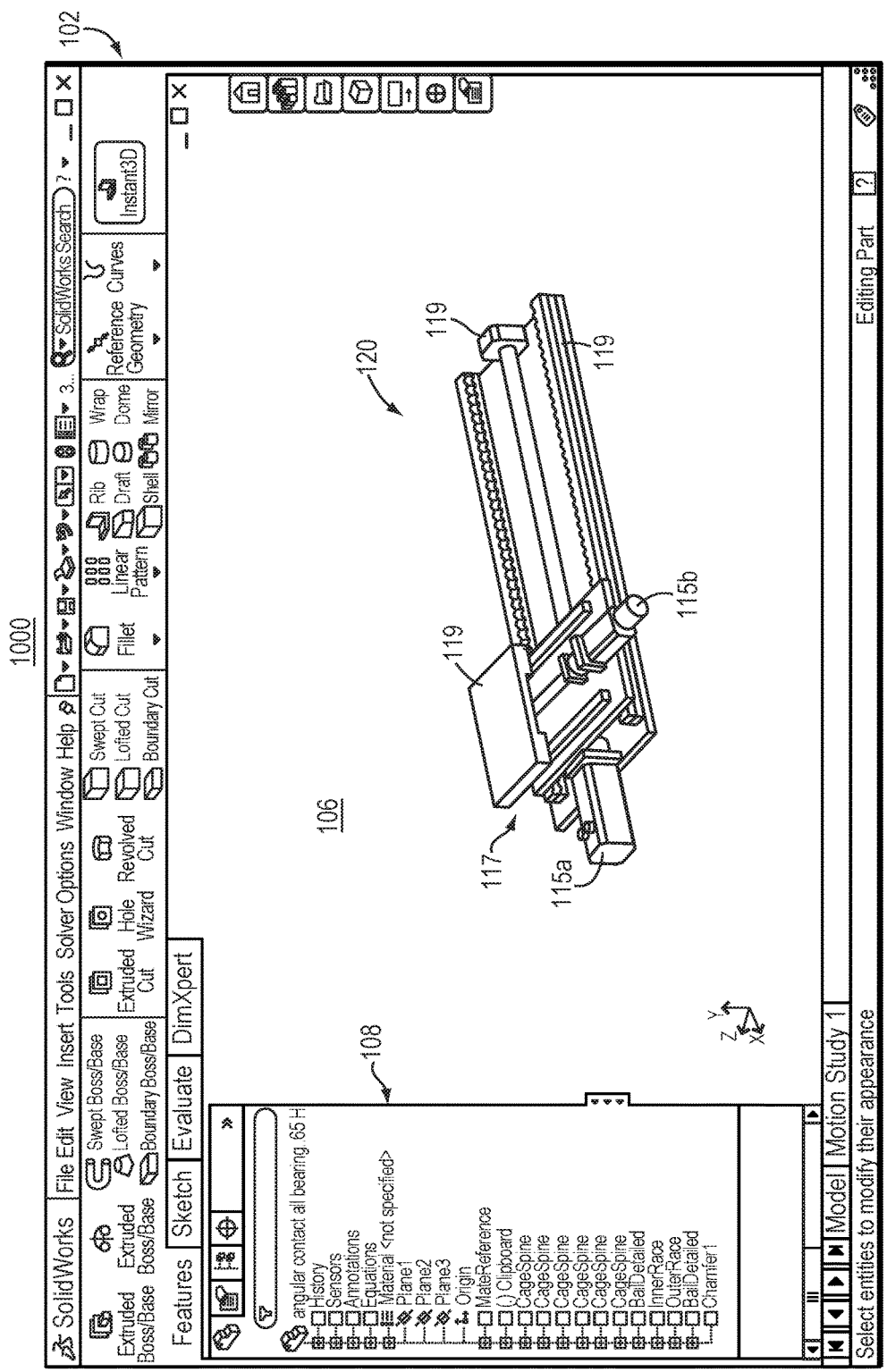

FIG. 1B shows one assembly 120 of the subject model 104 which may have numerous subassemblies and parts. The assembly 120 is formed of subassemblies 117 and parts 119. The user specifies or otherwise defines dimensional values, degrees of freedom, mates, and other properties for each subassembly 117 and part 119. Subassemblies 117 and parts 119 of the assembly 120 may articulate horizontally, vertically and/or rotationally, individually or coupled as a group, with certain limits and restrictions, or freely. Any combination of these aspects may need to be incorporated in the assembly 120 (and hence model 104) in order to accurately represent the corresponding real-world object.

To define the movements of the assembly 120, the user poses the assembly 120 in a first position in modeling space 106, and defines (or otherwise sets) the dimensional values, mating relationships and/or degrees of freedom of each subassembly 117 and part 119 (or generally referenced components 115, such as 115a, 115b) in the first position of the assembly 120. The dimensional values, degrees of freedom, and mate values are property settings defined through the property management user-interface of side panel 108.

In the illustrated example of FIG. 1B, a sliding platform subassembly 117 for carrying a robotic mechanism is at a starting position. The platform subassembly 117 can move laterally in two directions of a plane, that is fore and aft on a relatively short rail mechanism model component 115b, and orthogonally horizontally on a longer rail mechanism model component 115a. An example mate and respective mate value may be a coincident mate between sliding platform subassembly 117 that travels along longer rail mechanism model component 115a with a value of LimitDistance2=300 mm.

Figure 1C:
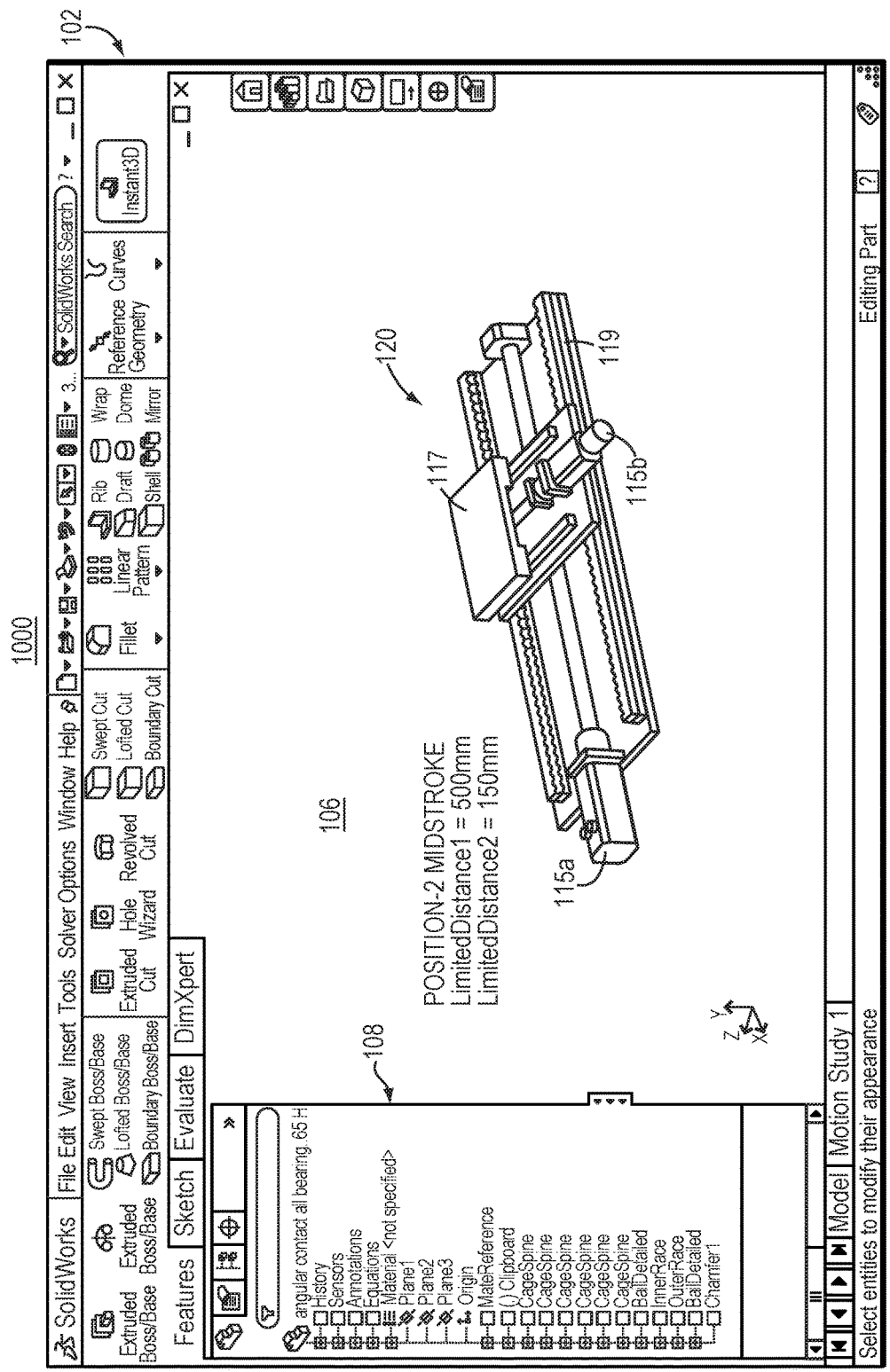

Next the user poses the assembly 120 in a second position, (as shown in FIG. 1C) and defines (sets) the dimensional values, mate values and degrees of freedom of each subassembly 117 and part 119 (components 115a, 115b, or generally 115) for the second position. In the illustrated example, the second position of assembly 120 has the sliding platform subassembly 117 at midstroke. There the mate value of the example mating relationship LimitDistance2 is set to 150 mm.

Figure 1D:
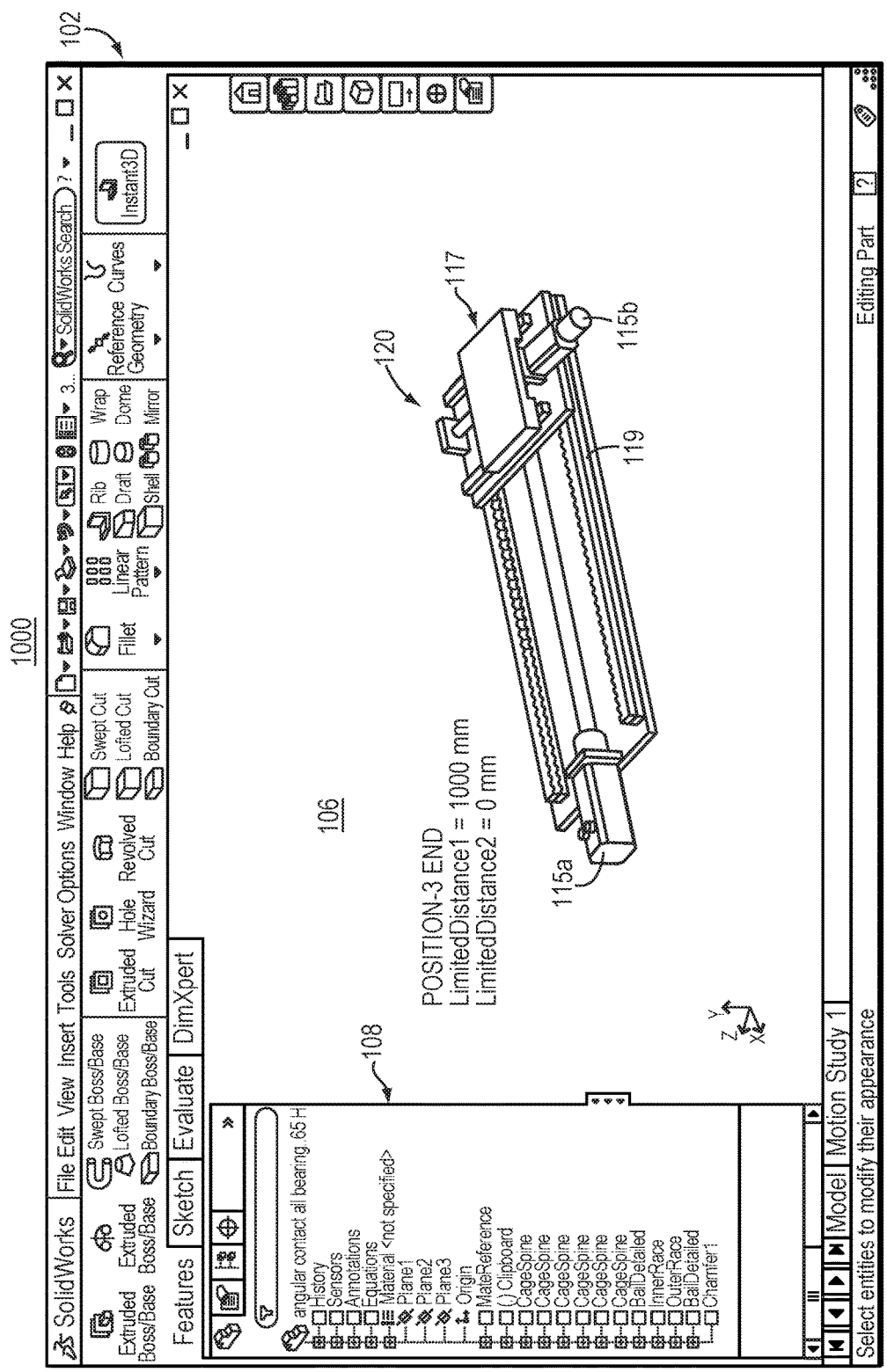

The user poses assembly 120 in an end of stroke position of subassembly 117 in FIG. 1D. For this position, the user also defines (sets) the dimensional values, degrees of freedom, and mate values of subassembly 117 and various parts 119 (components 115a, 115b, or 115 generally). The value of the example LimitDistance2 mate is set to 0 mm.

Accordingly, in the process of FIGS. 1B through 1D, the user has defined or otherwise specified Position 1-Start, Position 2-Midstroke, and Position 3-End respectively for model assembly 120. These positions serve as the user-defined positions of the model assembly 120.

In another example, FIGS. 7A through 7D show a robotic arm assembly 700. The robotic arm assembly 700 is comprised of a static Base Plate 701, an Arm Plate 702, a Gripper 703, and a Central Cylinder 705. The Gripper 703 holds a Payload 704, which may be a part or an assembly. The Central Cylinder 705 is oriented with its longitudinal axis normal to the upper planar surface of the Base Plate 701. In this orientation, the lower (downward facing) end of the Central Cylinder 705 is attached to the upper planar surface of the Base Plate 701. The Arm Plate 702 is generally of a rectangular prism shape that has planar surfaces parallel to the upper planar surface of the Base Plate 701. The Central Cylinder 705 intersects a proximal end of the Arm Plate 702, while the Gripper 703 is attached to the distal end of the Arm Plate 702. The Gripper 703 holds the Payload 704 extended from the distal end of the Arm Plate 702 relative to the Central Cylinder 705.

To define the movements of the robotic arm assembly 700, the user poses the robotic arm assembly in different positions in modeling space 106, and defines (or otherwise specifies) the dimensional values, mating relationships and/or degrees of freedom of each component (701, 702, 703, 705) for the respective position of the robotic arm assembly 700. The dimensional values, degrees of freedom, and mate values are property settings defined through the property management user-interface of side panel 108.

In this example, the user specifies property values and mate relationships that allow the Arm Plate 702 to: (i) be raised vertically to heights measured above the upper planar surface of the Base Plate 701 along the longitudinal axis of the Central Cylinder 705, and to (ii) sweep horizontally (or rotate) pivoting about the longitudinal axis of the Central Cylinder 705, independent of the vertical position of the Arm Plate 702. For non-limiting example, the user specifics property values for the Arm Plate 702 to move vertically through 150 mm and sweep horizontally (or rotate) through 90° in a given plane. In this sense, the Arm Plate 702 has a limited range of motion.

The Gripper 703 has articulating fingers that generate a pinching motion to hold the Payload 704. The Gripper 703 freely rotates about a longitudinal axis of the Arm Plate 702 (the axis of which is perpendicular to the longitudinal axis of the Central Cylinder 705). The rotation of the Gripper 703 and the Payload 704 is independent of both the vertical and horizontal movement of the Arm Plate 702.

Figure 7A:
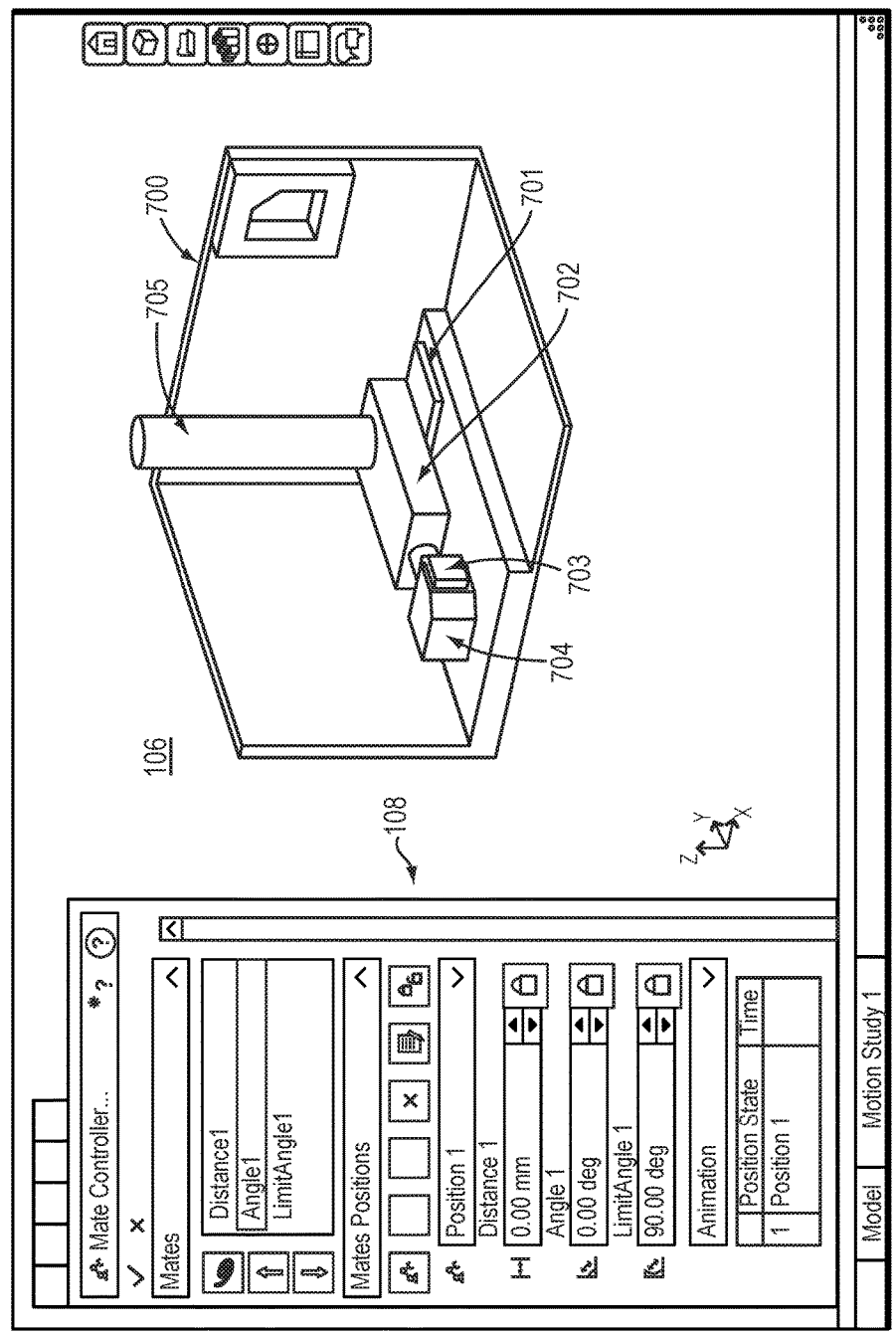
FIGS. 7A-7D are views of another embodiment of the user interface tool in the CAD system of FIGS. 1A-1D.

FIG. 7A shows the starting position (position 1) of the robotic arm 700 with the Arm Plate 702 touching the Base Plate 701. To define this position (position 1), the user specifies for non-limiting example model properties of height distance of 0.00 mm, an angle of Gripper 703 rotation of 0°, and a limit angel of 90° for the horizontal sweep (as shown in side panel 108 lower portion).

Figure 7B:
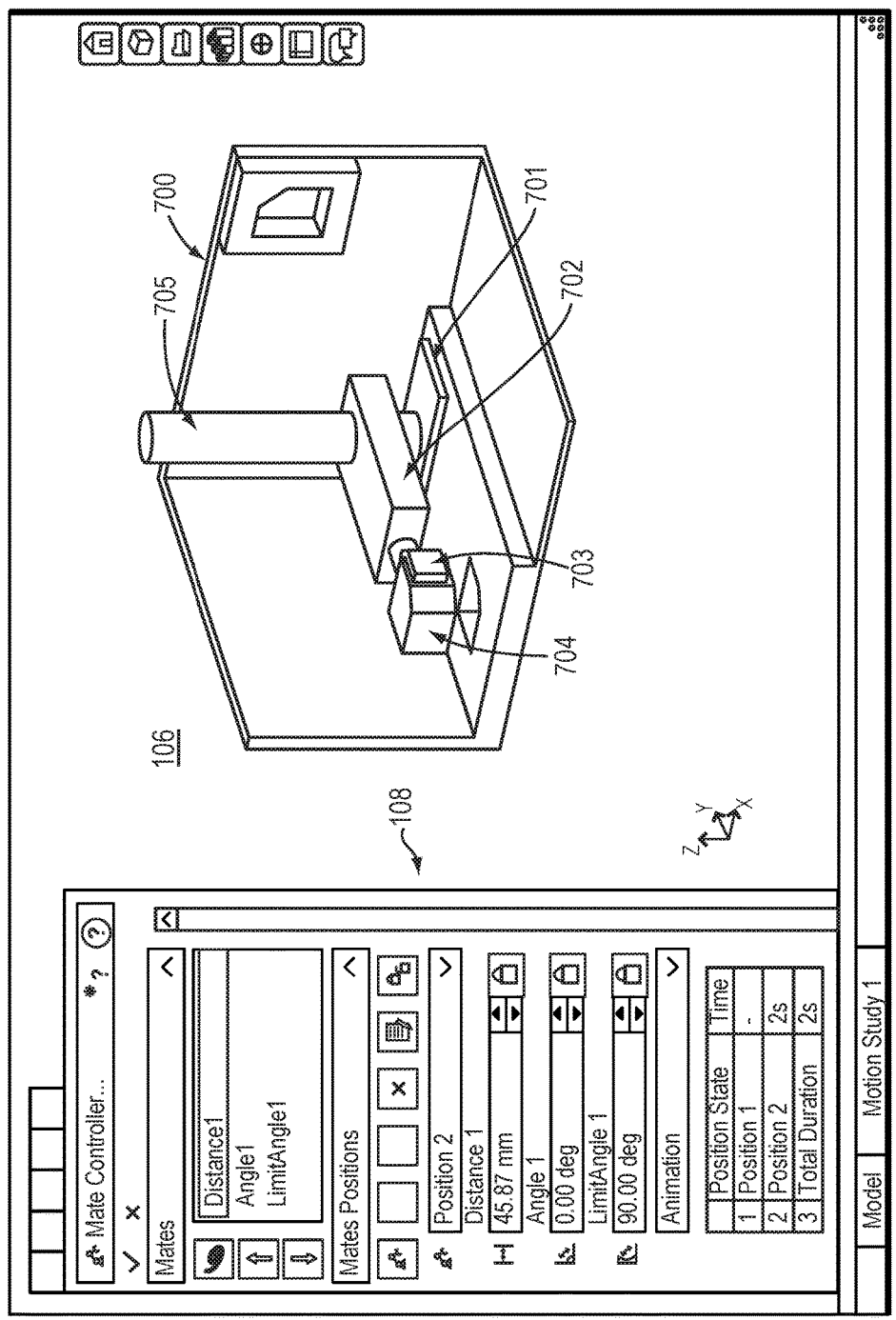

FIG. 7B shows a position (position 2) in which the user raised the Arm Plate 702 but did not apply any change in horizontal sweep limit of the Arm Plate 702 or rotation of the Gripper 703 and Payload 704. For non-limiting example, a position (position 2) has property values of Distance 1 representing height set at 45.87 mm; Angle 1 representing gripper rotation position set at 0°; Limit Angle 1 representing constraint on the angle of the horizontal sweep of Arm Plate 702 set at 90°.

Figure 7C:
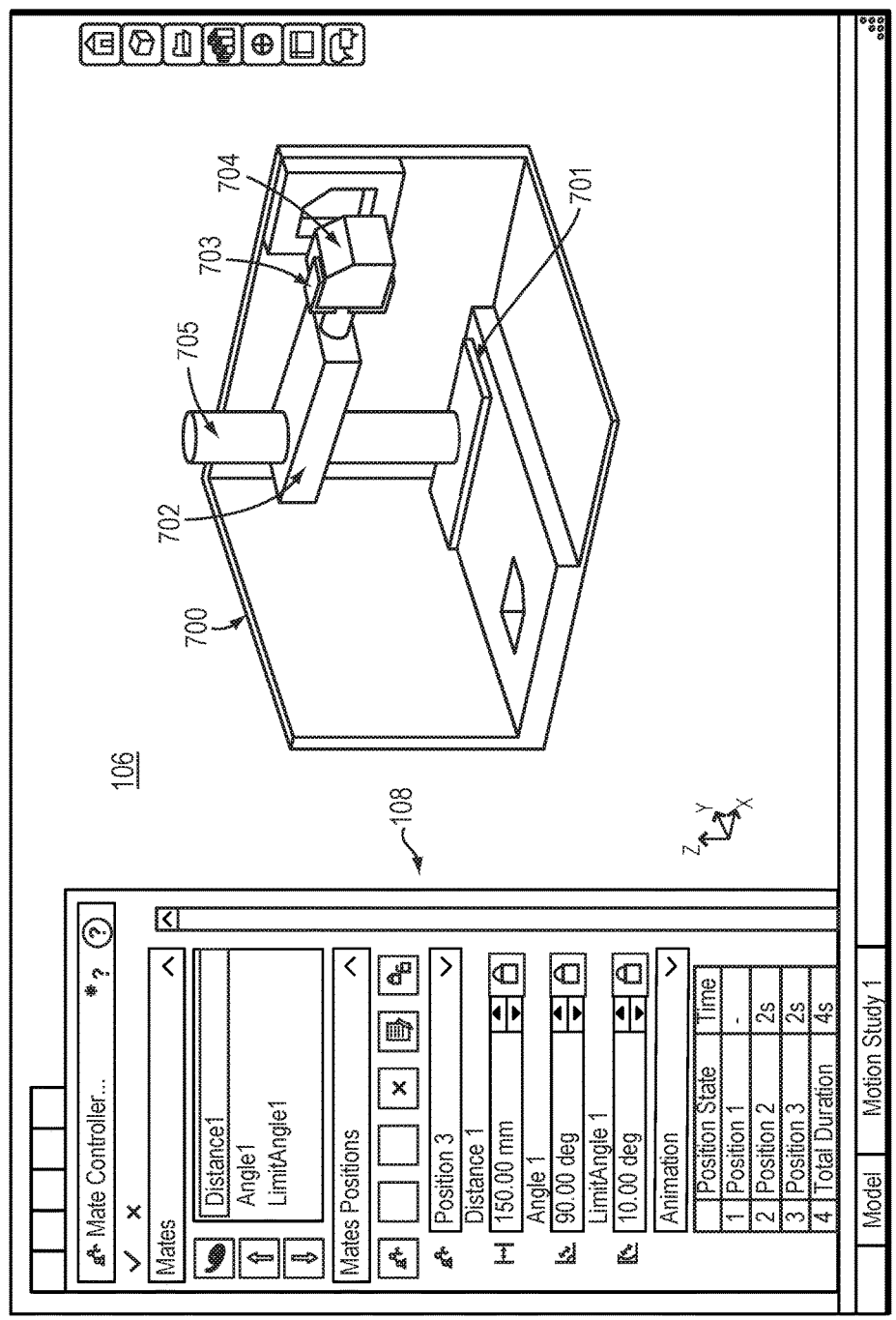

FIG. 7C shows a position (position 3) in which the user further raised the Arm Plate 702 and horizontally swept it 80°. Furthermore, the user rotated the Gripper 703 by 90° relative to the prior position of Gripper 703, causing Payload 704 to rotate as well. Property values for this position (position 3) are for non-limiting example: Distance 1 set at 150 mm, Angle 1 set at 90°, and Limit Angle set at 10°.

Figure 7D:
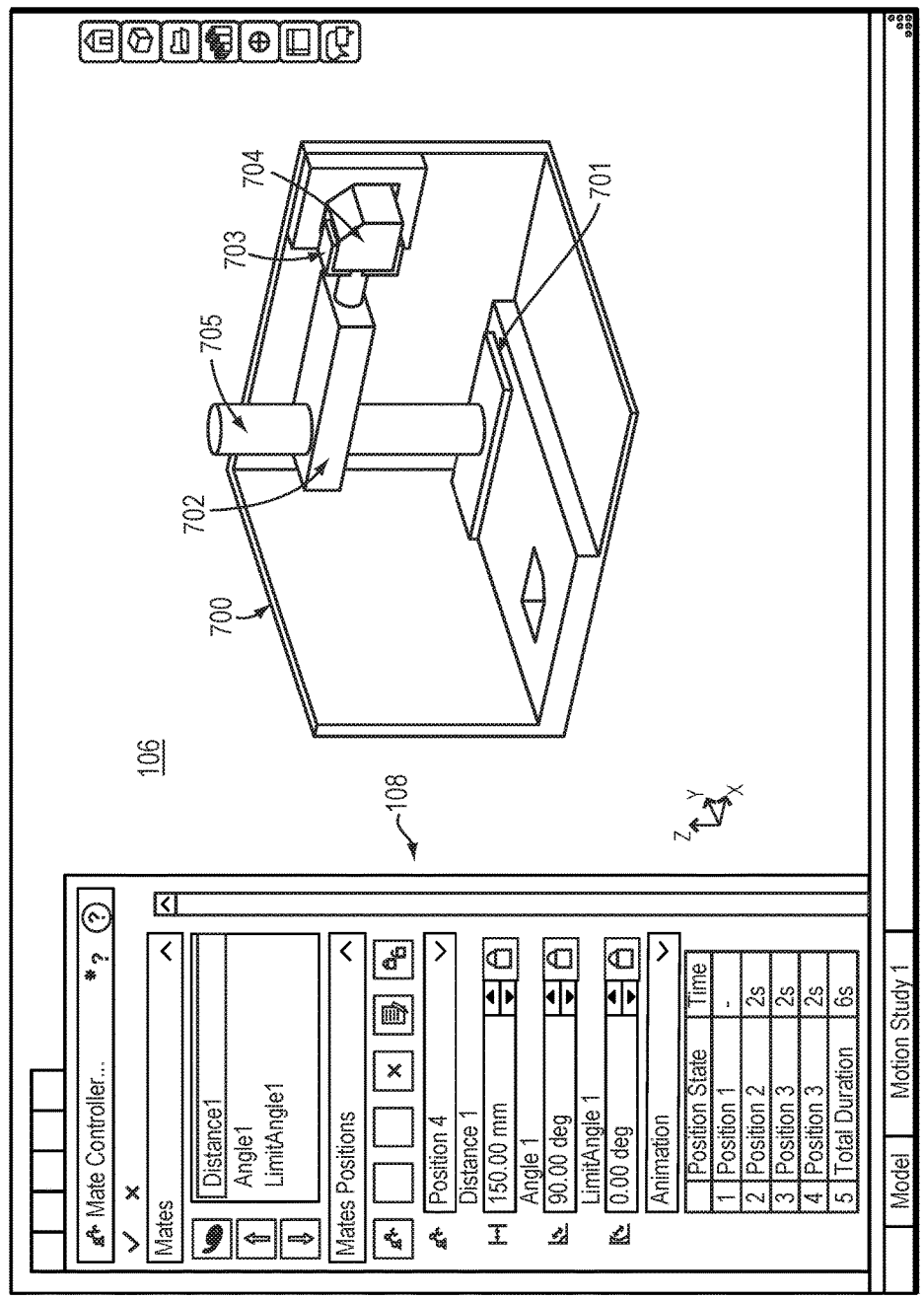

FIG. 7D shows the final position (position 4) in which the user has swept the Arm Plate 702 horizontally (rotated in the plane about a normal axis to the plane at the height of 150 mm) an additional 10° while not altering its height and has kept the Gripper 703 and the Payload 704 at their previous rotational angle (with respect to the longitudinal axis of the Arm Plate 702). The property values for the final position (position 4) are for non-limiting example: Distance 1 set at 150 mm, Angle 1 set at 90°, and Limit Angle set at 0°.

Accordingly, in the process of FIGS. 7A through 7D, the user has defined or otherwise specified property values and mate relationship values for all four positions (position 1 through position 4). These positions serve as the user-defined step-wise movement and desired motion of the robotic arm assembly 700 in a subject CAD model.

To more precisely capture and specify the movements (especially complex movements) of the assemblies 120, 700, subassembly 117, and parts 119, 701, 702, 703, 705, the CAD system 1000 employs an animator or simulator (not shown). One such animator/simulator is found in products under the trademark SOLIDWORKS by Applicant. The animator/simulator calculates the dimensional values and degrees of freedom for the subassembly 117 and parts 119, 701-703, 705 at intermediate positions between the user-defined positions of the assemblies 120, 700 of FIGS. 1B-1D and 7A-7D given the constraints of the user defined mates (and mate values). A movie file and calculated values output by the animator/simulator are a powerful and effective means of illustrating and communicating the motions and configurations of each subassembly 117 and parts 119, 701-703, 705 as the assemblies 120, 700 moves from one position to the next (i.e., striking the pose of the user 4148.1050-001 defined first position and moving to achieve through a range of motion the poses of the other user-defined positions).

Figure 2:
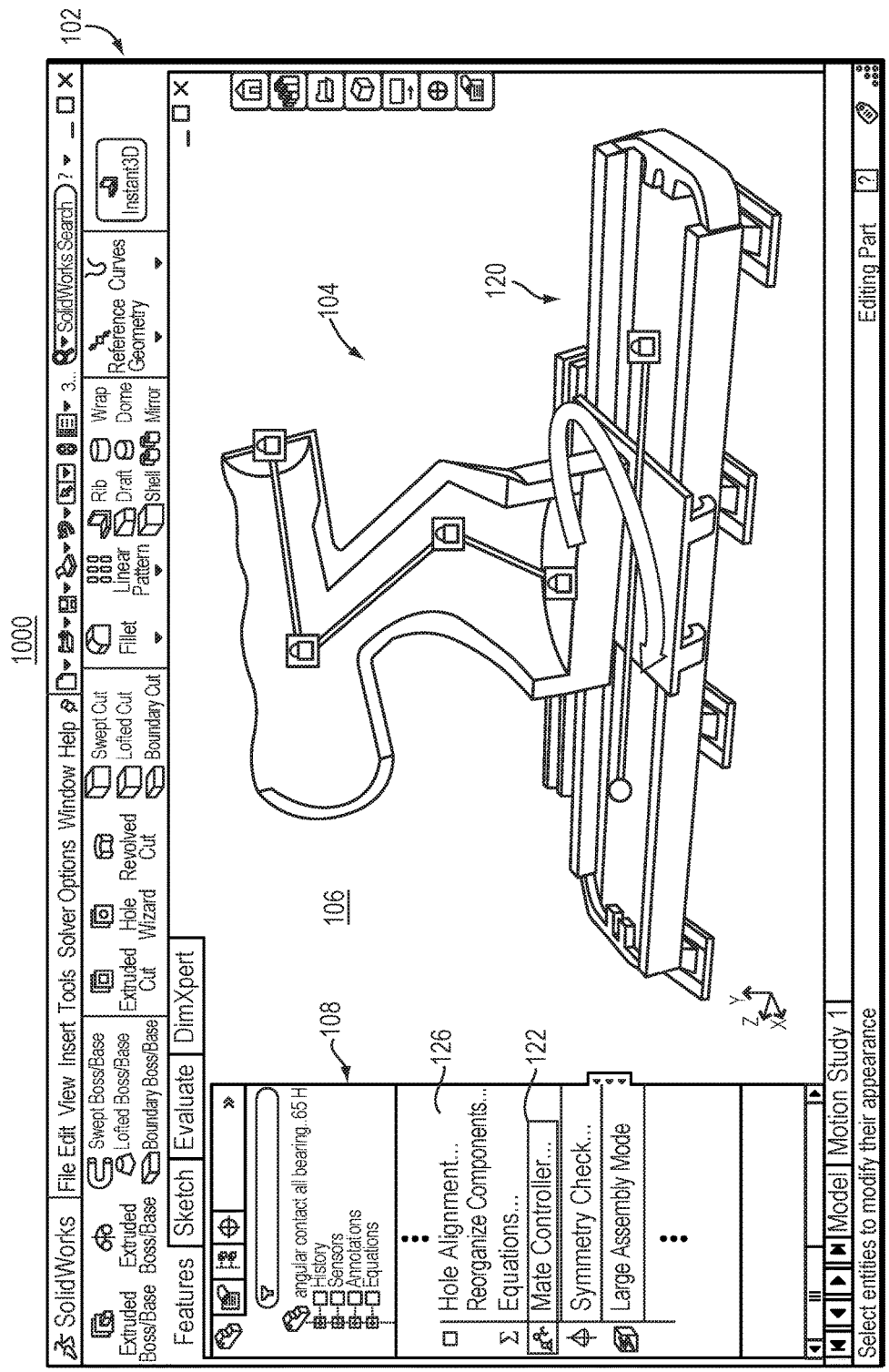
FIG. 2 is a schematic view of an embodiment of a user interface tool in the CAD system of FIGS. 1A-1D.
Figure 3A:
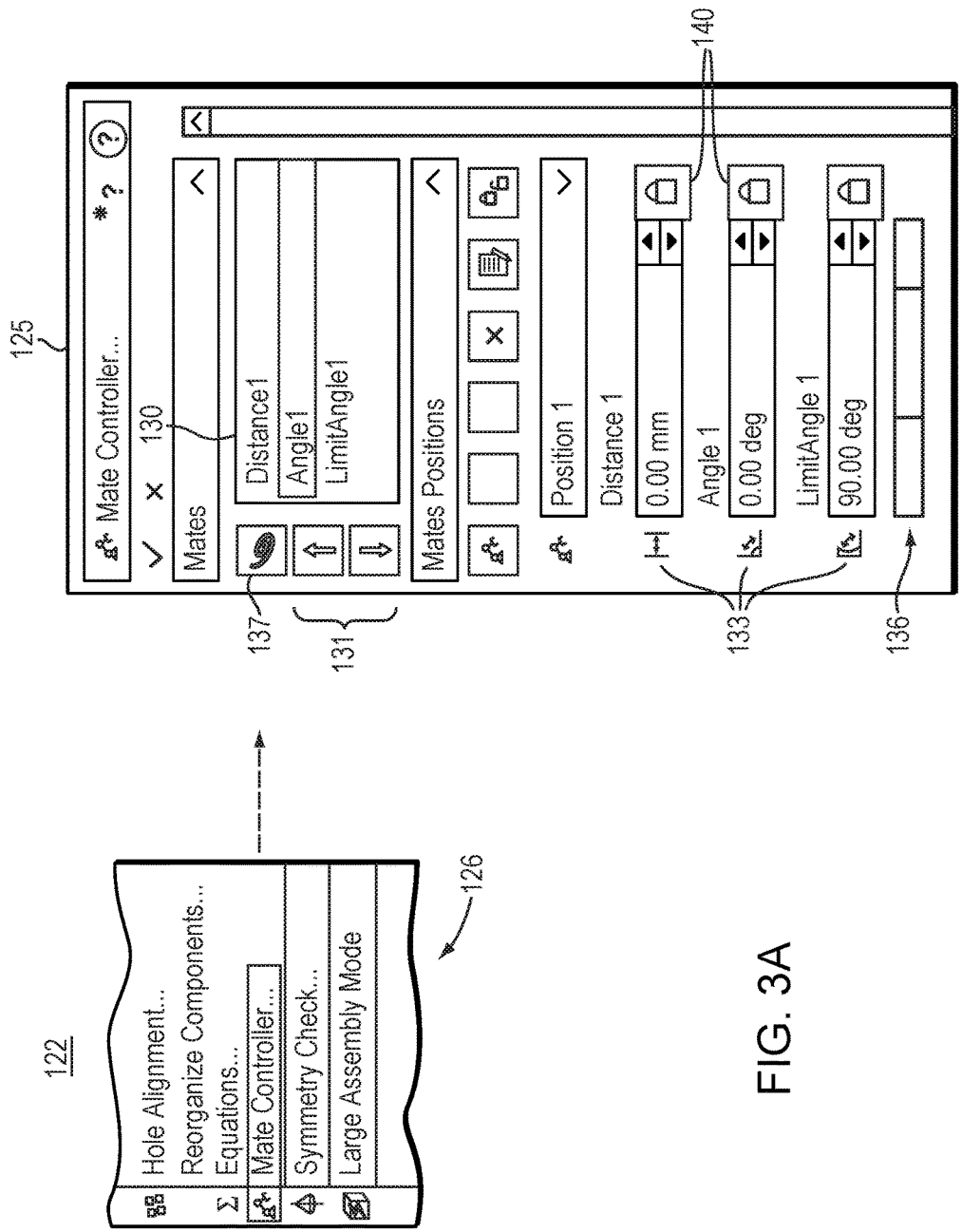
FIGS. 3A-3B are illustrations of a mate controller of the present invention.

In particular, the animation/simulation may expose an unexpected movement among the model components (assemblies 120, 700, subassembly 117, and parts 119, 701-703, 705). Where there are open degrees of freedom in an assembly 120, 700, the assembly may move uncontrollably because of the many producible solutions by the animator/simulator. Further a user using a cursor in the modeling space 106 dynamically moving a mechanism design with many degrees of freedom or with motion limited mate values can easily cause undesired results of motion. Users cannot actually achieve in a CAD model precise movement with mouse drag alone. To correct for and prevent such erroneous movements, CAD system 1000 utilizes an on-demand mate controller 125 of the present invention, shown and described next in conjunction with FIGS. 2-3B.

CAD system 1000 responds to user command relative to a model assembly 120, 700 and displays a user interface tool 122 (FIG. 2), for non-limiting example, from a set of assembly tools. In embodiments, user interface tool 122 is an option on a drop down or pop-up menu 126 of the assembly tool bar in the modeling space 106 or side panel 108. Known menu technology is utilized to support menu 126 presenting tool 122. Upon user selection of tool 122, the tool (CAD system 1000) launches an instance of mate controller 125 (shown in FIGS. 3A-3B) for subject assembly 120, 700. Mate controller 125 serves as a graphical user interface to mate properties in model 104 providing improved user experience and user-model design interaction as follows.

Mate controller 125 provides an ordered list 130 of mates (by name) to be controlled for the subject assembly. The mate names are provided in the ordered list 130 as having been either manually selected by the user or auto-populated by the instance of mate controller 125. For non-limiting example, during selection of user interface tool 122, the user pre-selects mates from side panel 108, mate controller 125 launches with the name of the preselected mates populating ordered list 130. However, if during selection of tool 122, the user does not pre-select any mates from side panel 108, mate controller 125 launches with ordered list 130 initially empty and mate controller 125 can auto-populate names of mates from the feature management tree (and in particular from the mate folder) for the subject assembly 120, 700 upon user selection of the the "collect all support mates" button 137. In allowing both manual and automatic mate selection, the mate controller 125 can find and consider all pertinent mates of the subject model 104 saving the user steps and increasing his efficiency in controlling mating relationships, while retaining the ability of the user to target an individual mate or a select group of mates by manually selecting only specific mate(s).

Other data structures instead of or in addition to the ordered list 130 are suitable.

Figure 3B:
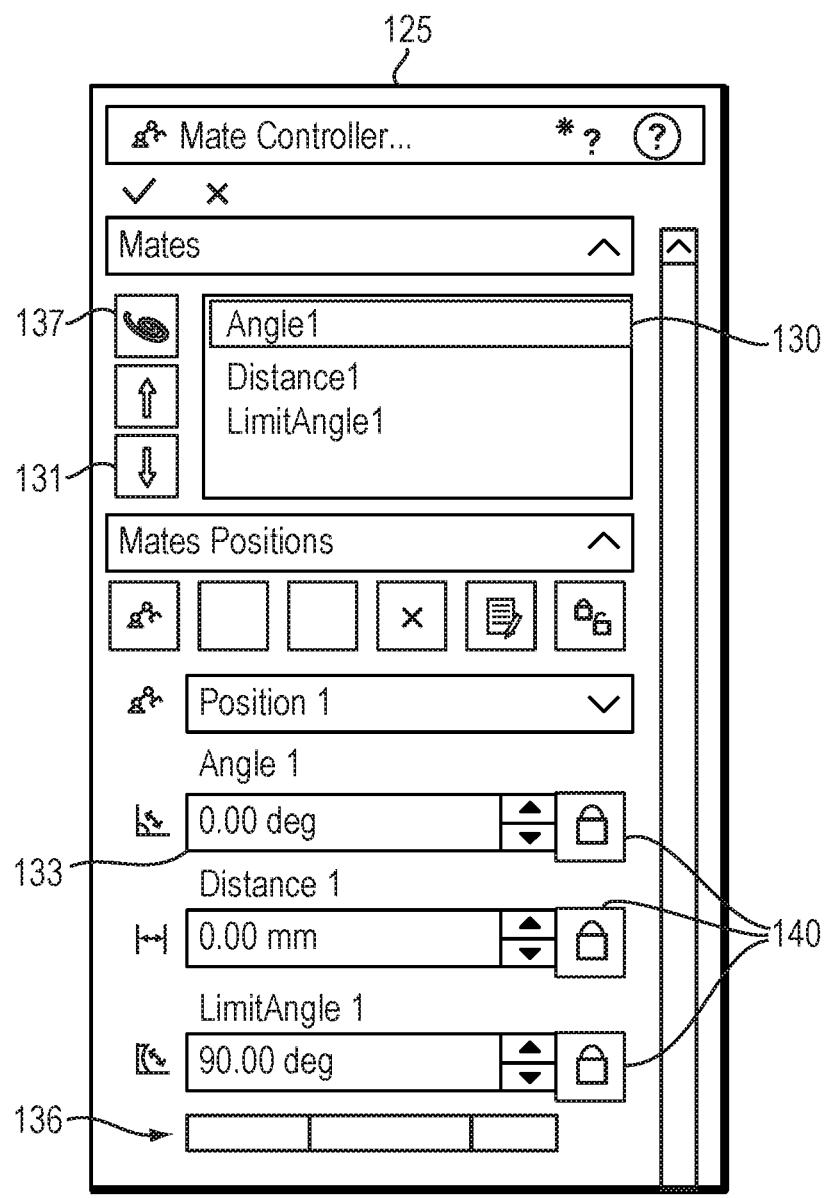

Pertinent buttons 131 of mate controller 125 enable the user to re-order the names of the mates in the ordered list 130. FIG. 3B shows the mates of list 130 of FIG. 3A reordered from {Distance1, Angle1, LimitAngle1} to {Angle1, Distance1, LimitAngle1}. The order of mates (mates' names) in list 130 can be interactively reordered by the user. Using an ordered list interface is a more intuitive and visually straightforward means than prior art interfaces for controlling mates and their affects to precisely position assembly components.

Mate controller 125 also provides and displays, per user-defined position of the subject model assembly 120, 700, the various mate values 133 and degrees of freedom of the assembly components 115, 701-703, 705. The displayed mate values 133 are user-interactive meaning the user can change or edit them here. Some mates have associated sliders 136 or other mechanisms for the user to relatively effortlessly change mate values using a percentage basis, maximum/minimum indicator, or other mechanisms. The changes to displayed mate values made by the user through mate controller 125 are implemented as changed property values in model 104.

In embodiments, upon mate controller 125 launch, the current user-defined position of the subject model assembly 120, 700, the various mate values 133 and degrees of freedom of the assembly components 115, 701-703, 705 are automatically saved as the position data for Position 1. Within a given position, such as Position 1 shown in FIG. 3B, toggle button or icon 140 of mate controller 125 sets the driven/driving state of an individual mate. In the driving state, the mate value 133 displayed by mate controller 125 drives the position of assembly components 115, 701-703, 705 in the modeling space 106. In the driven state, the mate value 133 displayed by the mate controller 125 is driven by the position to which the user drags the corresponding component in modeling space 106. In other words, drive state icon (or toggle switch) 140 enables the user to temporarily unlock mates so that corresponding model components 115 (e.g., subassemblies 117, parts 119, 701-703, 705) can be visually positioned (by the user) from the modeling space 106. This repositioning of assembly components 115, 701-703, 705 in modeling space 106 results in new mate values (settings) and refined degrees of freedom. Upon arriving at the new mate values and redefined degrees of freedom, the user can subsequently relock the mate, and in this way the mate controller 125 enables the user to add new or edit existing user-defined assembly positions based on the then achieved (displayed) values or settings for the mates. The mate controller 125 saves this position data (degrees of freedom and mate values) of newly added or edited user-defined assembly as model properties data in model 104. Further the saved (or otherwise captured) position data advantageously can be used as input to a motion analysis, such as an animation or simulation.

In addition, mate controller 125 also enables the user to change order of positions in the series of user-defined assembly positions (including the newly added positions), and saves the re-ordered positions in the model properties data. Changes in the order of positions here also change the order of position changes in motion studies of the CAD model. In this way, mate controller 125 enables user interactive changing of position order (e.g., order of position changes) of a mate in a model assembly.

As a result, a less cumbersome method (set of steps) than the prior art approaches (e.g., key frame approach) is provided by the on-demand mate controller 125 for adjusting mate values and repositioning assembly components. The approach of the present invention is also free of the requisite input of time elements (total time or start/end time of assembly positions) of prior art.

Figure 4:
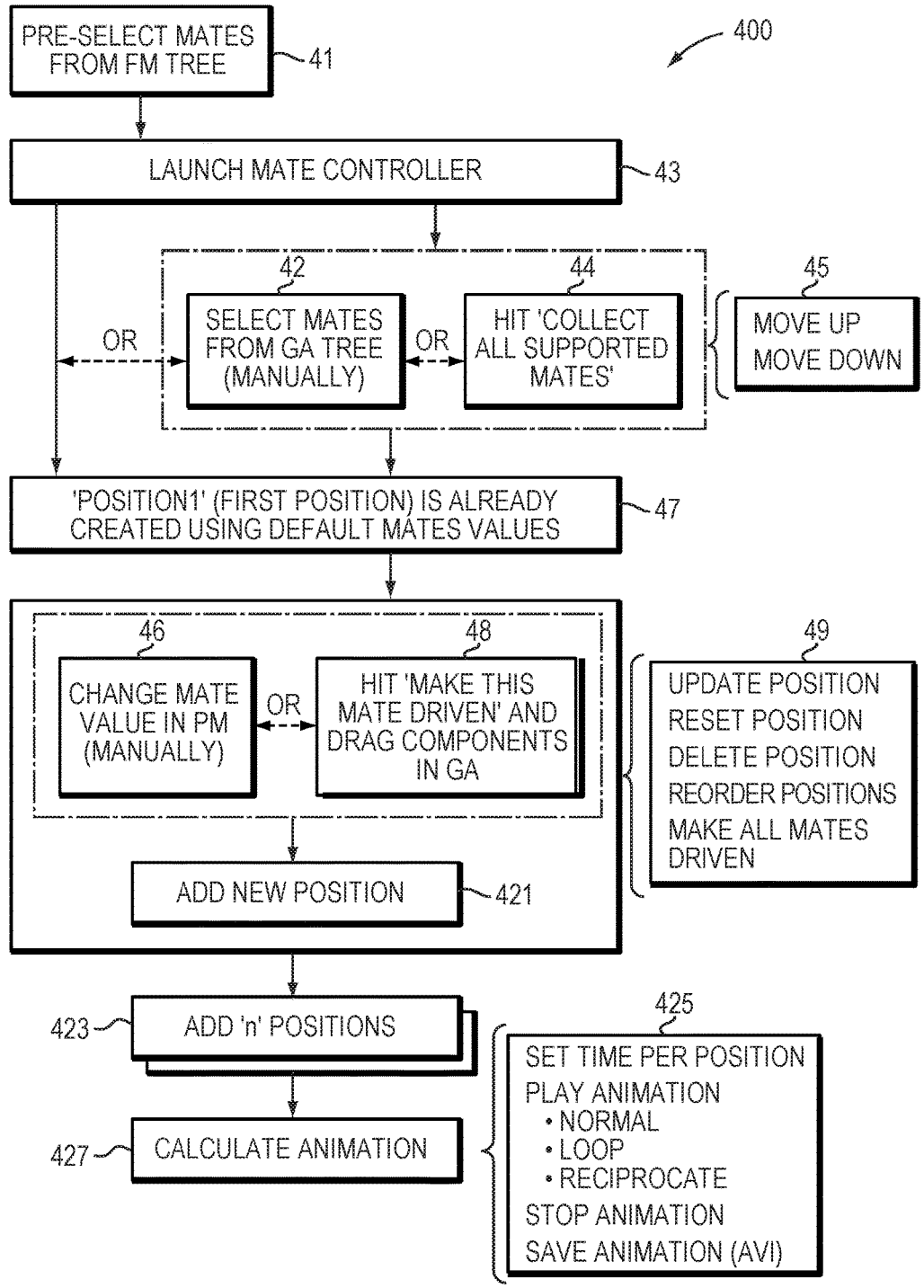
FIG. 4 is a Flow Diagram of embodiments.

Turning now to FIG. 4, a flow diagram (or processor routines/module) 400 of embodiments of mate controller 125 is presented. At step 41, processor routine 400 begins by allowing the user to pre-select mates of a subject assembly 120, 700 in display model 104 from the feature management tree or side panel 108. Then, in response to user command routine/module 400 displays assembly tool menu 126 and initializes.

In response to user selection of the user interface tool 122 from the displayed assembly tool menu 126, step 43 of routine/module 400 launches and displays an instance of mate controller 125. The instance of mate controller 125 automatically selects the mates that the user pre-selected in step 41 and populates the names and values of the preselected mates into ordered list 130. Otherwise, the instance of mate controller 125 launches with an initially empty ordered list 130, without any mates selected. The instance of mate controller 125 allows the user to either manually select mates (at 42) from the model 104 or to select the option 44 of mate controller 125 auto-populating the names of mates into ordered list 130. Steps 42 and 44 allow for the user to either modify their pre-selected mates from step 41 or if no mates were pre-selected during step 41, populate ordered list 130 of mate controller 125 with names of mates. A linked list, array or other data structure and associated subsystem at 45 holds and supports the ordered list 130 of mate names and operations thereof. The list data structure and subsystem 45 enables the user to reorder the listed mates as described above in FIGS. 3A-3B.

Routine/module 400 at step 47 creates and displays in mate controller 125 a set of mate values and degrees of freedom defining a first position of the subject assembly. Step 47 may default to the mate values and degrees of freedom of the various mates in a user-defined position (such as previously described in FIGS. 1B and 3B as a non-limiting example) stored and saved as model properties. In turn, mate controller 125 enables the user to (a) change 46 an individual mate value via the property management user-interface, or to (b) temporarily unlock 48 the mate and drag assembly components in modeling space 106 to reposition the assembly consequently refining mate values and component degrees of freedom. Positions data structure and subsystem 49 holds the assembly position data (per position settings, i.e. the various mate values and component degrees of freedom) and supports the user operations for updating a position, resetting a position, deleting a position, reordering positions, and unlocking/relocking mates (i.e. changing drive state). Routine 400 saves the resulting position settings as model property data in subject model 104.

Step 421 supports adding a new position for the subject assembly. The positions data structure 49 stores the mate settings and degrees of freedom for the assembly components in the newly added position. Routine 400 saves the resulting new position values/position settings as model property data in subject model 104.

Mate controller module/routine 400 also readily provides, from positions data structure 49, any number of the saved positions 423 of the assembly components for use by an animator (or simulator) 427. The supporting animation data structure and subsystem 425 provides (a) animation calculated time settings per position, (b) playback options for the animation (e.g. normal, loop, reciprocate), (c) a stop animation option, and (d) saving or storing of the movie file (.avi or other file format) resulting from the animation calculation. The playback options are for playing to the end user the created animation movie file after the animation has been calculated at 427. The normal playback mode plays the animation movie one time from beginning to end. The loop playback mode continuously plays the animation movie from beginning to end restarting at the beginning of each iteration. The reciprocate playback mode continuously plays the animation movie alternating between beginning-to-end display and from-end-to-beginning display of the movie.

Computer Support

Figure 6:
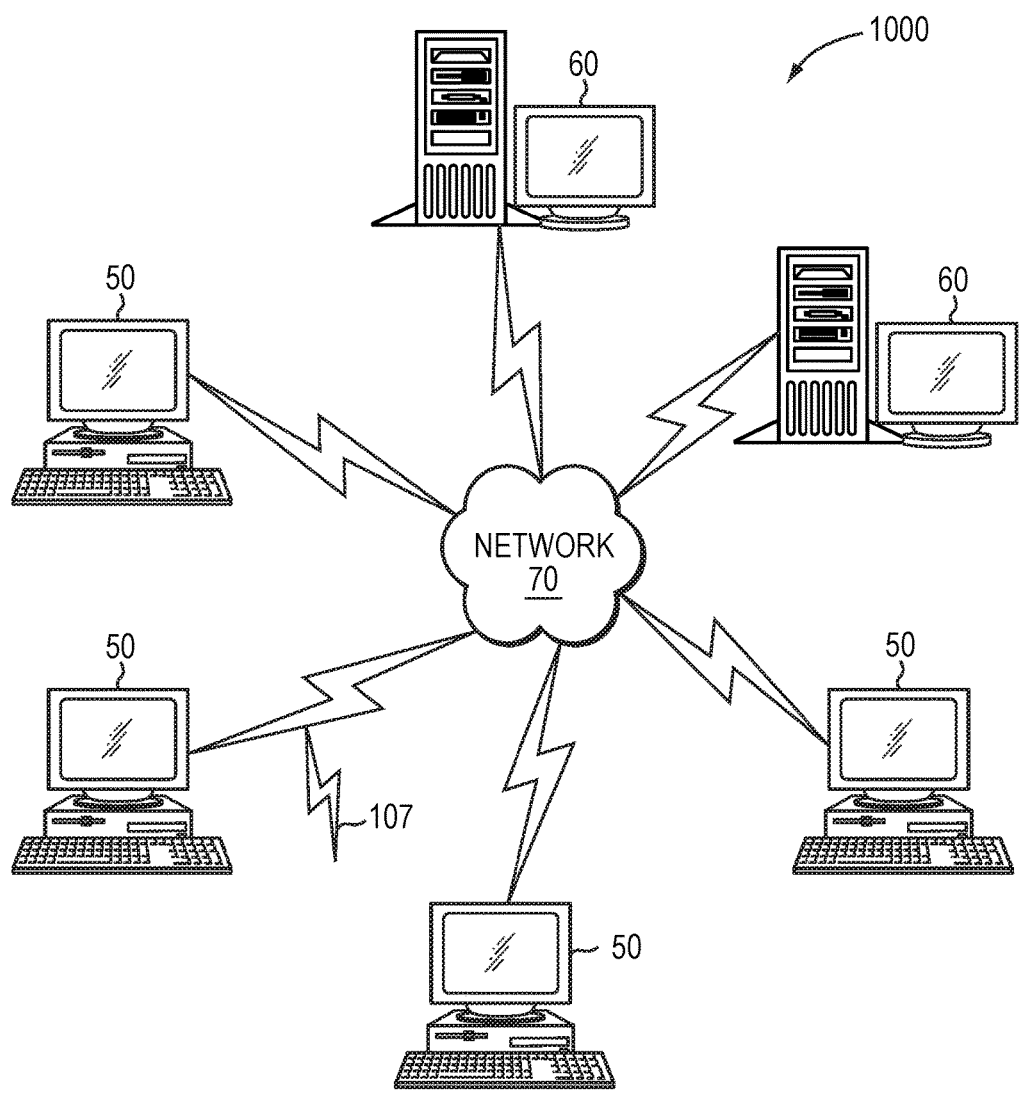
FIG. 6 is a schematic view of a computer network embodying the present invention.

FIG. 6 illustrates a computer network or similar digital processing environment in which the present invention may be implemented.

Client computer(s)/devices 50 and server computer(s) 60 provide processing, storage, and input/output devices executing application programs and the like. Client computer(s)/devices 50 can also be linked through communications network 70 to other computing devices, including other client devices/processes 50 and server computer(s) 60. Communications network 70 can be part of a remote access network, a global network (e.g., the Internet), a worldwide collection of computers, Local area or Wide area networks, gateways and cloud computing that currently use respective protocols (TCP/IP, Bluetooth, etc.) to communicate with one another. Other electronic device/computer network architectures are suitable.

Figure 5:
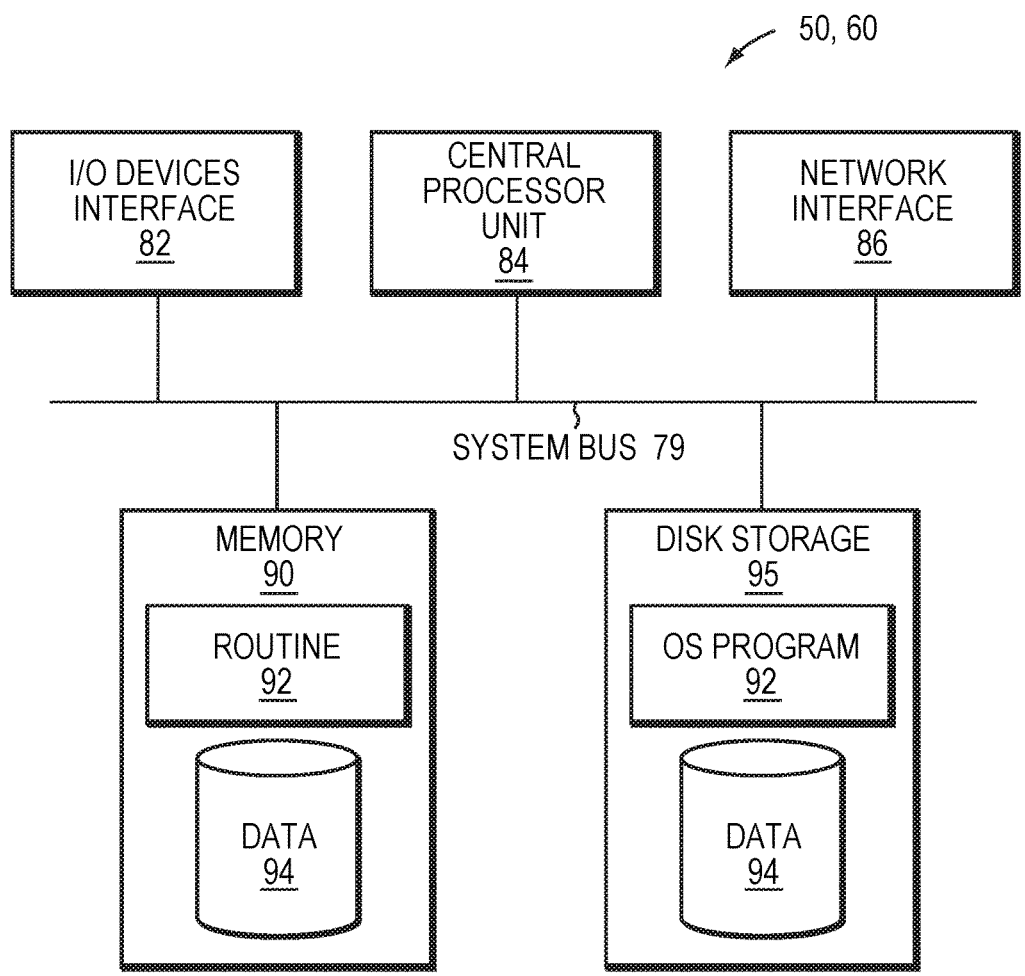
FIG. 5 is a block diagram of a computer systems embodying the present invention.

FIG. 5 is a diagram of the internal structure of a computer (e.g., client processor/device 50 or server computers 60) in the computer network of FIG. 6. Each computer 50, 60 contains system bus 79, where a bus is a set of hardware lines used for data transfer among the components of a computer or processing system. Bus 79 is essentially a shared conduit that connects different elements of a computer system (e.g., processor, disk storage, memory, input/output ports, network ports, etc.) that enables the transfer of information between the elements. Attached to system bus 79 is I/O device interface 82 for connecting various input and output devices (e.g., keyboard, mouse, displays, printers, speakers, etc.) to the computer 50, 60. Network interface 86 allows the computer to connect to various other devices attached to a network (e.g., network 70 of FIG. 6). Memory 90 provides volatile storage for computer software instructions 92 and data 94 used to implement an embodiment, such as CAD system 1000, of the present invention (e.g., user interface tool 122, mate controller 125, and supporting software code and data structures of 400 detailed above). Disk storage 95 provides non-volatile storage for computer software instructions 92 and data 94 used to implement an embodiment of the present invention. Central processor unit 84 is also attached to system bus 79 and provides for the execution of computer instructions.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.; a memory medium; and the like) that provides at least a portion of the software instructions for the invention system. Computer program product 92 can be installed by any suitable software installation procedure, as is well known in the art. In another embodiment, at least a portion of the software instructions may also be downloaded over a cable, communication and/or wireless connection 107. Some embodiments provide execution of the invention process routines 92 supported by data 94 as a global computer network service or other computer service accessible by computer network 70 or communication connection 107. In other embodiments, the invention programs are a computer program propagated signal product embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 50 may receive and read, such as by receiving the propagation medium and identifying a propagated signal embodied in the propagation medium, as described above for computer program propagated signal product.

While this invention has been particularly shown and described with references to example embodiments thereof, it will be understood by those skilled in the art that various changes in form and details may be made therein without departing from the scope of the invention encompassed by the appended claims.

For example, in the above discussions and description, mention of modeling software and products under the trademark SOLIDWORKS is made. Equivalent or other modeling software, products and CAD systems are suitable.

What is claimed is:

1. A method of CAD (Computer-Aided Design) modeling comprising:
    in a modeling space of a CAD system, receiving a CAD model of a real-world object, the CAD model representing the real-world object in computer memory, the CAD model being formed of a model assembly, the model assembly being an assembly of plural components, and different positions of the model assembly being defined by different mating relationships of components of the CAD model with respect to geometric relationships;
    in response to user command, providing a mate controller as a graphical user interface to the CAD model that controls the mating relationships including user interactively controlling settings for the mating relationships in the CAD model;
    auto-populating in the mate controller indications of the mating relationships in the CAD model, the indications being names or types of the mating relationships in the model assembly, the mate controller holding and displaying to the user the indications in an order, said auto-populating forming an ordered list of the names or types; and
    enabling user interactive re-ordering of the indications, and responsively defining position changes of the model assembly components.

2. A method as claimed in claim 1 further comprising:
    the model assembly being one of multiple model assemblies forming the CAD model, each model assembly having a respective set of components and mating relationships of said components; and
    through a user interface tool, launching an instance of the mate controller in response to user command with respect to a certain one of the model assemblies of the CAD model.

3. A method as claimed in claim 2 wherein
    the list of names is user-interactively re-orderable, and the order of the names in the list affects the order of the position changes in an animation of the certain model assembly.

4. A method as claimed in claim 2 further comprising:
    displaying through the mate controller current settings of the mating relationships in the certain model assembly, and for each of different positions of the certain model assembly, the mate controller presenting mating relationship values and degrees of freedom of assembly components.

5. A method as claimed in claim 2 further comprising:
    using the mate controller to save, per position of the certain model assembly, data including mating relationship values and degrees of freedom of assembly components; and
    applying the saved per position data to a motion study.

6. A method as claimed in claim 2 further comprising:
    through the mate controller, enabling a user to change an order of positions of the certain model assembly, the order of positions affecting an order of position changes in motion studies of the CAD model or portions thereof.

7. A method as claimed in claim 2 further comprising:
using the mate controller, adding a new position of the certain model assembly based on current settings for the mating relationships.

8. A method as claimed in claim 1 further comprising:
utilizing the mate controller to temporarily unlock a subject mating relationship so that model components can be visually positioned in a display of the CAD model resulting in refined settings of the subject mating relationship.

9. A method as claimed in claim 8 wherein the mate controller employs a toggle switch to temporarily unlock and relock mating relationships.

10. A CAD modeling system comprising:
a mate controller graphical user interface to a modeling space, the modeling space configured to receive a CAD model of a real-world object, the CAD model representing the real-world object in computer memory, the CAD model being formed of a model assembly, the model assembly being an assembly of plural components, and different positions of the model assembly being defined by different mating relationships of components of the CAD model with respect to geometric relationships;
the mate controller providing user-interactive control of the mating relationships settings for the mating relationships in the CAD model; and
a user interface tool configured to launch instances of the mate controller in response to user command, for a given instance, the mate controller configured to:
(i) be auto-populated with indications of the mating relationships in the CAD model, the indications being names or types of the mating relationships in the model assembly,
(ii) hold and display to the user, the indications in an order, said auto-populating of the mate controller forming an ordered list of the names or types, and
(iii) enable user interactive re-ordering of the indications, and responsively define position changes of the model assembly components according to the reordered indications.

11. A CAD modeling system as claimed in claim 10 wherein:
the model assembly is one of multiple model assemblies forming the CAD model, each model assembly having a respective set of components and mating relationships of said components; and
the user interface tool launches instances of the mate controller with respect to a certain one of the model assemblies of the CAD model.

12. A CAD modeling system as claimed in claim 11 wherein
the list of names is user-interactively re-orderable, and the order of the names in the list affects the order of position changes in an animation of the certain model assembly.

13. A CAD modeling system as claimed in claim 11 wherein the mate controller displays current settings of the mating relationships in the certain model assembly, and for each of different positions of the certain model assembly, the mate controller presents mating relationship values and degrees of freedom of assembly components.

14. A CAD modeling system as claimed in claim 11 wherein:

per position of the certain model assembly, the mate controller saves position data including mating relationship values and degrees of freedom of assembly components; and
the mate controller applies the saved per position data to a motion study.

15. A CAD modeling system as claimed in claim 11 wherein the mate controller enables a user to change an order of positions of the certain model assembly, the order of positions affecting an order of position changes in motion studies of the CAD model or portions thereof.

16. A CAD modeling system as claimed in claim 10 wherein the mate controller temporarily unlocks a subject mating relationship enabling a user to visually position model components in a display of the CAD model resulting in refined settings of the subject mating relationship.

17. A CAD modeling system as claimed in claim 16 wherein the mate controller employs a toggle switch to temporarily unlock and relock mating relationships.

18. A computer program product for CAD modeling comprising:
a non-transitory computer readable memory medium supporting CAD modeling;
program code stored on the non-transitory computer readable memory medium and configuring a processor executing the program code to:
operate on a CAD model of a real-world object, the CAD model representing the real-world object in computer memory, the CAD model being formed of a model assembly, the model assembly being an assembly of plural components, and different positions of the model assembly being defined by different mating relationships of components of the CAD model with respect to geometric relationships;
in response to user command, provide a mate controller as a graphical user interface to the CAD model that controls the mating relationships and settings for the mating relationships in the CAD model;
auto-populate in the mate controller indications of the mating relationships in the model assembly, the indications being names or types of the mating relationships in the model assembly, the mate controller holding and displaying to the user, the indications in an order that is user-interactively re-orderable, the mate controller defining position changes in a motion study of the model assembly or portions thereof by using the reordered indications, said auto-populating forming an ordered list of the names or types; and
per position of the model assembly, use the mate controller to save mating relationship values and degrees of freedom of assembly components, the saved mating relationship values and degrees of freedom of assembly components serving as position data to the motion study.

19. A computer program product as claimed in claim 18 wherein:
the program code further configures the processor to utilize the mate controller to temporarily unlock a subject mating relationship so that model components can be visually positioned in a display of the CAD model resulting in refined settings of the subject mating relationship; and
the mate controller employs a toggle switch to temporarily unlock and relock one or more of the mating relationships.

* * * * *